US011054749B2

(12) United States Patent
Peters et al.

(10) Patent No.: US 11,054,749 B2
(45) Date of Patent: Jul. 6, 2021

(54) PHOTORESIST STRIPPING COMPOSITION AND METHOD

(71) Applicant: Versum Materials US, LLC, Tempe, AZ (US)

(72) Inventors: Richard D. Peters, Tempe, AZ (US); Michael Phenis, Tempe, AZ (US); Travis Acra, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/412,563

(22) Filed: May 15, 2019

(65) Prior Publication Data

US 2019/0361352 A1 Nov. 28, 2019

Related U.S. Application Data

(60) Provisional application No. 62/674,905, filed on May 22, 2018.

(51) Int. Cl.
*C11D 7/34* (2006.01)
*G03F 7/42* (2006.01)
*H01L 21/027* (2006.01)

(52) U.S. Cl.
CPC .......... *G03F 7/426* (2013.01); *H01L 21/0273* (2013.01)

(58) Field of Classification Search
CPC ................................................ C11D 11/0047
USPC ........................................................ 510/175
See application file for complete search history.

(56) References Cited

U.S. PATENT DOCUMENTS

| 4,165,295 | A | | 8/1979 | Vander Mey |
| 4,221,674 | A | * | 9/1980 | Vander Mey ............ C09D 9/00 134/3 |
| 4,395,348 | A | | 7/1983 | Lee et al. |
| 4,844,832 | A | | 7/1989 | Kobayashi et al. |
| 4,992,108 | A | | 2/1991 | Ward et al. |
| 5,728,664 | A | | 3/1998 | Michelotti et al. |
| 5,863,346 | A | | 1/1999 | Michelotti et al. |
| 6,261,735 | B1 | | 7/2001 | Sahbari |

(Continued)

FOREIGN PATENT DOCUMENTS

| JP | 62-035357 A | 2/1987 |
| JP | 2002531879 T2 | 9/2002 |

(Continued)

OTHER PUBLICATIONS

European Patent Office. European Search Report on Appln No. EP19 17 5780, dated Oct. 9, 2019.

(Continued)

*Primary Examiner* — Gregory E Webb
(74) *Attorney, Agent, or Firm* — William T. Slaven, IV

(57) ABSTRACT

An organic photoresist stripping composition and method of using the composition with silicon wafers having an insulating layer and metallization on the wafers, having an aryl sulfonic acid or alkylaryl sulfonic acid or mixtures thereof; 1,3-dihydroxybenzene (resorcinol) or sorbitol or mixtures thereof; one or more hydrocarbon solvents having a flash point of greater than about 65° C., and optionally less than about 0.5% by weight water based on the total weight of the composition. The composition may also be used for the removal of other materials from other substrates.

21 Claims, 2 Drawing Sheets

Tafel plot for Formulation 5 and Comparative Formulation 1.

(56) References Cited

U.S. PATENT DOCUMENTS

| | | | |
|---|---|---|---|
| 6,548,464 B1* | 4/2003 | Machac, Jr. ............. | C09D 9/00 |
| | | | 134/38 |
| 6,660,460 B2 | 12/2003 | Sahbari | |
| 8,658,583 B2 | 2/2014 | Lee et al. | |
| 8,940,104 B2* | 1/2015 | Zhong ...................... | C11D 1/22 |
| | | | 134/39 |
| 2003/0228990 A1* | 12/2003 | Lee .......................... | C11D 3/30 |
| | | | 510/202 |
| 2010/0279910 A1* | 11/2010 | Lee ..................... | C11D 3/3409 |
| | | | 510/176 |
| 2011/0146724 A1 | 7/2011 | Lee | |
| 2017/0293228 A1* | 10/2017 | Peters ..................... | G03F 7/425 |

FOREIGN PATENT DOCUMENTS

| | | |
|---|---|---|
| JP | 2012-203257 A | 10/2012 |
| KR | 20070023004 A | 2/2007 |
| KR | 20120036604 A | 4/2012 |
| TW | 201134940 A | 10/2011 |

OTHER PUBLICATIONS

Japanese Patent Application No. JP2019-095894, Office Action dated Mar. 16, 2021 (Translation included).

\* cited by examiner

Tafel plot for Formulation 5 and Comparative Formulation 1.

Open circuit potential for Formulation 5 and Comparative Formulation 1.

PHOTORESIST STRIPPING COMPOSITION AND METHOD

CROSS-REFERENCE TO RELATED APPLICATIONS

This application claims priority to U.S. provisional application 62/674,905 filed on May 22, 2018, the entire contents of which is incorporated herein by reference thereto for all allowable purposes.

BACKGROUND OF THE INVENTION

This invention relates to a photoresist and residue stripping composition and method, particularly useful in the fabrication of integrated circuits. More particularly, it relates to such a stripping composition and method which is useful for both positive and negative photoresist, and which is free of compounds that have presented safety and environmental problems in prior art photoresist stripping compositions and methods.

In integrated circuit manufacturing, various compositions have been used for stripping organic photoresist polymers from silicon dioxide and other insulator surfaces, as well as metallized silicon dioxide or other insulator surfaces. Examples of some stripper compositions include those disclosed in U.S. Pat. Nos. 4,395,348, 5,728,664, 5,863,346, 8,658,583, 6,660,460, and 6,261,735, 4,992,108, 4,844,832, 4,165,295.

U.S. Pat. No. 8,658,583 teaches a method to reduce sulfuric acid and sulfur trioxide concentrations in blends of certain organic sulfonic acid and certain halogen-free hydrocarbon solvent. The presence of the sulfuric acid and sulfur trioxide attack aluminum when these blends are used to remove photoresist from semiconductor wafers with exposed aluminum features. The method involves heating the blends of the organic sulfonic acid and the halogen-free hydrocarbon solvent for an extended period of time.

There are safety and environmental problems associated with prior art stripper compositions comprising chlorinated hydrocarbon solvents, phenol, low flash point solvents, and other carcinogenic or mutagenic components. Additionally, there are problems with prior art stripper compositions that incorporate components that undergo phase separation when stored or during transport. Therefore, there is still a need for improved stripper compositions.

An effective replacement for the generally used above photoresist stripping compositions should meet one or more of the following criteria: The composition should be water rinsable, non-corrosive to silicon, silicon dioxide, aluminum, aluminum silicon alloys, aluminum copper alloys, nickel chromium alloys, silver, titanium, titanium tungsten alloys, nickel, nickel vanadium alloys, gallium arsenide, and gold under normal operating conditions, it should be free of toxic, carcinogenic, or mutagenic components, possess a high flash point, and comprise components that do not undergo phase separation.

Thus, while the art of photoresist stripping compositions and methods is a well developed one, a need still remains for a suitable replacement stripping composition and method for the compositions and methods currently in general use in the semiconductor industry.

BRIEF SUMMARY OF THE INVENTION

The invention provides a photoresist and post-etch residue stripping composition and process. The photoresist stripping composition includes aryl sulfonic acid or alkylaryl sulfonic acid or mixtures thereof; 1,3-dihydroxybenzene (resorcinol) or 1,4-dihydroxybenzene (hydroquinone) or sorbitol or mixtures thereof; and a hydrocarbon solvent(s) having a flash point of greater than about 65° C. The composition may further comprise water and/or sulfuric acid. The composition may comprise from about 20 to about 40 percent by weight of aryl sulfonic acid and/or alkylaryl sulfonic acid based on the total weight of the composition. The composition may comprise from about 0.2 to about 3.5 weight percent of 1,3-dihydroxybenzene and/or sorbitol based on the total weight of the composition, and the composition may comprise from about 60 to about 85 percent by weight of hydrocarbon solvent based on the total weight of the composition. The compositions may further comprise less than 0.5 percent by weight of water (or a positive amount up to less than about 0.5 weight percent water) and greater than about 0.08 weight percent sulfuric acid.

The method for stripping photoresist from a substrate of this invention comprises contacting the photoresist with the above composition at a temperature between about 20 and about 150° C. The composition is allowed to contact the photoresist for times of from about 15 seconds to two hours or more, depending on the photoresist employed and the curing conditions used with the photoresist.

While applicant does not wish to be bound by any particular theory of operation, it is believed that the 1,3-dihydroxybenzene or 1,4-dihydroxybenzene or sorbitol utilized in the composition and method of this invention acts as a corrosion inhibitor for aluminum, titanium, nickel and other metals. It is believed that the 1,3-dihydroxybenzene or sorbitol may adsorb onto metal surfaces and may form a passivation layer that provides corrosion inhibition and may prevent the formation of polymeric residue deposits on the metal surfaces during high temperature processing used in stripping photoresist from integrated circuits. With use of the 1,3-dihydroxybenzene or 1,4-dihydroxybenzene or sorbitol or mixtures thereof, the composition and method of this invention need not employ phenol or a chlorinated hydrocarbon solvent. Accordingly, the photoresist and/or residue stripping compositions and methods of this invention provide one or more of the following benefits: (a) stripping compositions free of phenol, catechol, and chlorinated hydrocarbon solvents; (b), stripping compositions that are compatible with the metals and insulating layers commonly employed in integrated circuits; (c) stripping compositions that will not significantly attack aluminum and/or silicon dioxide and/or nickel and/or silver and/or nickel vanadium alloys and/or gallium arsenide and/or titanium and/or titanium tungsten alloys; (d) a stripping compositions and methods which will give photoresist stripping results that are at least comparable to that obtained with the use of commercially available photoresist stripping compositions containing catechol; (e) stripping compositions and methods which are suitable for use with both positive and negative photoresists and post-etch residue; (f) stripping compositions with a flash point of at least 65° C. providing improved safety when used; (g) stripping compositions having fewer phase separation issues (and precipitated solids therein) due to components not being present in the composition at or near their solubility limit.

The attainment of the foregoing and related objects, advantages and features of the invention should be more readily apparent to those skilled in the art, after review of the following more detailed description of the invention.

DETAILED DESCRIPTION OF THE INVENTION

Figure 1:
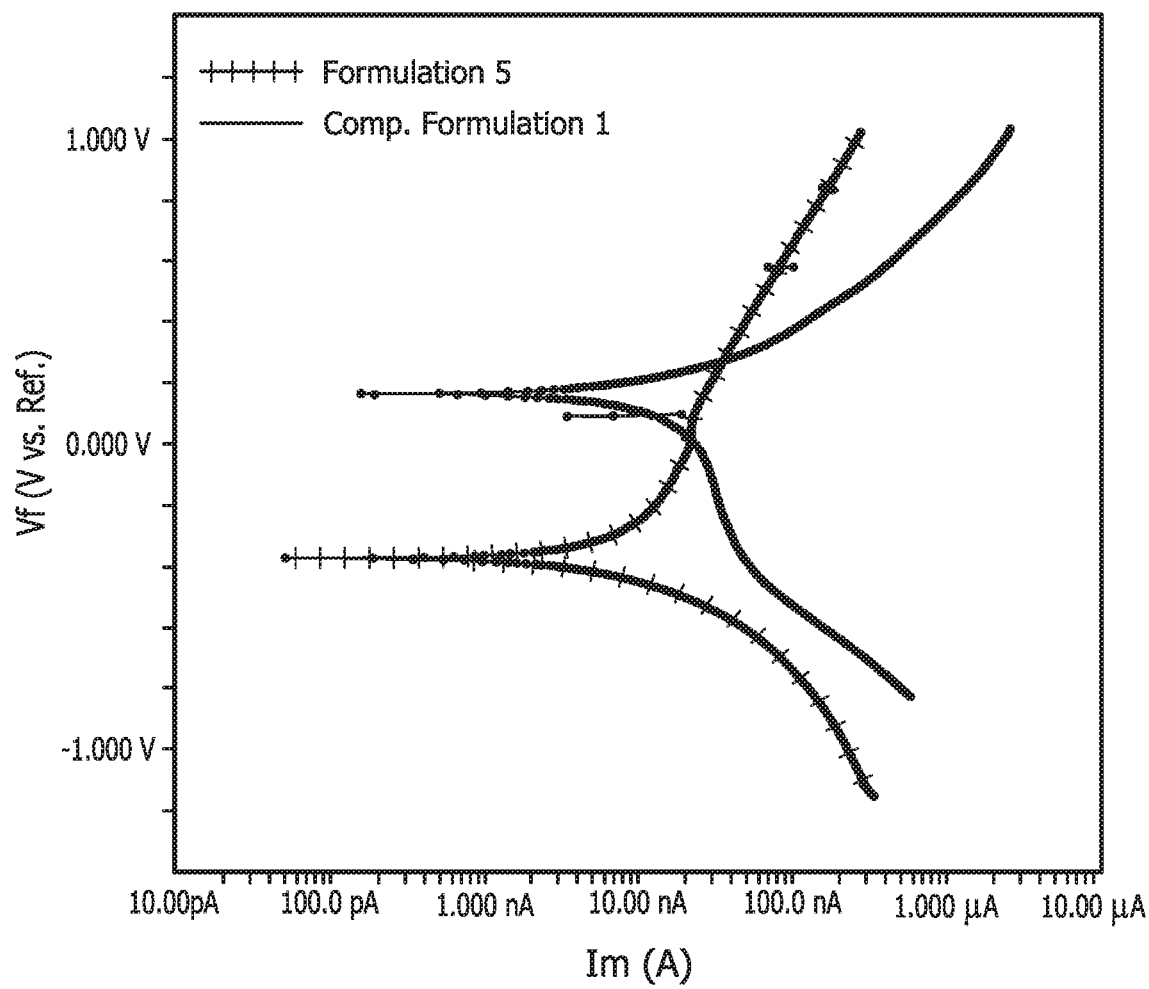
FIG. 1 is a Tafel plot for Formulation 5 and Comparative Formulation 1.

The use of the terms "a" and "an" and "the" and similar referents in the context of describing the invention (especially in the context of the following claims) are to be construed to cover both the singular and the plural, that is, "one or more than one," unless otherwise indicated herein or clearly contradicted by the context. The terms "comprising," "having," "including," and "containing" and their respective conjugates are to be construed as open-ended terms (i.e., meaning "including, but not limited to,") unless otherwise noted, but also include the partially closed or closed terms of "consisting essentially of" and "consisting of". Recitation of ranges of values herein are merely intended to serve as a shorthand method of referring individually to each separate value falling within the range, unless otherwise indicated herein, and each separate value is incorporated into the specification as if it were individually recited herein, and any value reported herein can be used, in any combination, as the beginning or end of a range for the aspect for which it is described. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. All percentages are weight percentages and all weight percentages are based on the total weight of the composition (prior to any optional concentration and/or dilution thereof). Every use of "one or more" means and can be substituted with "one or more than one" everywhere it appears. Additionally, "one or more" can also be substituted with "two or more than two" or "three or more than three" or "four or more than four" and so on.

Suitable examples of organic sulfonic acids that may be utilized in the composition and method of this invention include aryl sulfonic acids or alkylaryl sulfonic acids or mixtures thereof, such as, C10-C16 alkyl benzene sulfonic acids, dodecylbenzene sulfonic acid, and the like. An example of the organic sulfonic acid is a commercial product available under the trade name of Calsoft LAS-99 sold by Pilot Chemical, which contains approximately 1 weight percent sulfuric acid according to U.S. Pat. No. 8,658,583. The preferred range for the amount of the aryl sulfonic acids and/or alkylaryl sulfonic acid present in the composition is from about 20 to about 40, or from about 22 to about 38, or from about 25 to about 35, or from about 22 to about 27, or from about 25 to about 40, or from about 20 to about 30 weight percent.

The composition may contain sulfuric acid. The amount of sulfuric acid in the composition may be greater than about 0.08, or greater than about 0.1, or greater than about 0.12, or greater than about 0.15, or greater than about 0.16, or greater than about 0.2, or greater than about 0.25, or greater than about 0.3, or greater than about 0.4, or greater than about 0.5, and/or less than about 1 percent by weight, or less than about 0.9 percent, or less than about 0.8 percent, or less than about 0.7 percent, or less than about 0.6 percent, or less than about 0.5 percent, or from about 0.08 to about 0.6, or from about 0.08 to about 0.5, or from about 0.1 to about 0.6, or from about 0.12 to about 0.6, or from about 0.15 to about 0.6, or from about 0.16 to about 0.6, or from about 0.16 to about 0.5, or from about 0.16 to about 0.4, or from about 0.2 to about 0.5, or from about 0.2 to about 0.4 percent by weight of the composition.

The amount of 1,3-dihydroxybenzene or sorbitol or mixtures thereof in the composition is less than about 3.5, less than about 2.0, less than about 2.5, or from about 0.2 to about 3.5, or from about 0.2 to about 3, or from about 0.2 to about 2.5, or from about 0.2 to about 2, or from about 0.5 to about 2.4, or from about 1 to about 3.5, or from about 0.5 to about 2, or from about 0.5 to about 1.5, or from about 1 to about 2.4, or from about 1.5 to about 2.0 weight percent of the composition.

The 1,3 dihydroxybenzene or sorbitol are used well below their respective solubility limits. The amount of 1,3-dihydroxybenzene or sorbitol or hydroquinone is below its solubility limit, respectively, in the composition by at least 0.1, or at least 0.2, or at least 0.5, or at least 1.0, or at least 1.5, or at least 2.0 weight percent. The solubility limits are determined at room temperature using the desired composition of this invention except for continuing to add 1,3-dihydroxybenzene or sorbitol or hydroquinone or catechol until the solution has more than one liquid phase and/or liquid phase and solid phase.

The solvent is one or more halogen-free hydrocarbon compounds containing at least eight carbon atoms, wherein the one or more halogen-free hydrocarbon compounds is miscible with the one or more organic sulfonic acids and having a flash point of at least 65° C., or from about 65° C. to 100° C., or from about 65° C. to 75° C., or from about 65° C. to 85° C., or from about 75° C. to at least 100° C., or of at least 90° C., or from about 90° C. to 100° C., or from about 80° C. to 100° C. The solvent is preferably refined from petroleum and mostly comprises C8-C18 hydrocarbons. The solvent may be predominantly an aromatic containing hydrocarbon compound or may be predominantly an aliphatic containing hydrocarbon compound or mixtures thereof. The solvents comprising predominantly aromatic hydrocarbons tend to have flashpoints in the ranges described above up to 85° C. and the solvents comprising predominantly aliphatic hydrocarbons tend to have flashpoints in the ranges described above greater than about 75° C.

In one embodiment, the solvent may be an aromatic containing hydrocarbon compound containing at least 50% by weight C9-C12 alkyl benzenes (of the hydrocarbon solvent). Such an aromatic hydrocarbon compound is exemplified by the alkyl benzenes alone or mixtures thereof as well as mixtures of greater than about 1% by weight of naphthalene (of the hydrocarbon solvent). The preferred aromatic hydrocarbon solvents have flashpoints of 65° C. or higher or 65° C. to 85° C. and initial boiling points of 180° C. or higher. Examples of this aromatic hydrocarbon compound are commercial products available under the trade name of Solvesso 150 sold by ExxonMobil Chemical, ShellSol A150 sold by Shell Chemicals, Sure Sol 150 sold by Flint Hills Resources, or Atosol 150 sold by Total Petrochemicals. The aromatic hydrocarbon compounds which may be contained in the aromatic hydrocarbon compound, supplementing the C9-C12 alkyl benzenes, include lower (for examples, C7 or C8) and higher (for examples, C13 through C18) alkyl benzenes and naphthalenic compounds, examples include methyl benzene, propyl benzene, tetrahydronaphthalene, dodecyl benzene, didodecyl benzenes, octyl benzene, decyl benzene, isopropyl naphthalenes, diisopropyl naphthalenes and the like.

In another embodiment, the hydrocarbon compound having a flash point of 75° C. or higher, or 90° C. or higher, or 90° C. to 100° C. is refined from petroleum and is predominantly (greater than about 50% by weight of the hydrocarbon solvent) an aliphatic compound that contains predominantly (greater than about 50% by weight of the hydrocarbon solvent) C11-C16 paraffins and naphthenes. The preferred aliphatic hydrocarbon solvents have flashpoints of 75° C. or higher and initial boiling points of 200° C. or higher. The hydrocarbon compound is greater than about 50% by weight paraffins (of the hydrocarbon solvent). Examples of this aliphatic hydrocarbon are commercial products available under the trade name of ShellSol D70 sold by Shell Chemical Company or Isopar M Fluid sold by ExxonMobil Chemical.

The inventive remover solution should contain the above defined hydrocarbon solvent and/or mixtures thereof in an amount in the range from about 60% to about 85% by weight, or from about 60% to about 80% by weight, or from about 60% to about 78% by weight, or from about 60% to about 75% by weight, or from about 63% to about 73% by weight, or from about 63% to about 73.5% by weight, or from about 65% to about 75% by weight, or from about 65% to about 85% by weight, or from about 66% to about 72% by weight, or from about 70% to about 75% by weight.

By including a hydrocarbon compound having a boiling point of 180° C. or higher in the composition of this invention, the evaporation of the composition when used will be decreased thereby creating a safer environment and a more consistent composition even upon heating and use in the method of this invention. Additionally, with a flash point of 65° C. or higher, the composition will be safer to transport and store.

The composition may contain water as a contaminant or water may be absorbed during production, handling, or packaging of the composition. Care should be taken to reduce the level of water present in the composition as small levels of moisture will increase attack of metals. In one embodiment, the amount of water present in the composition is a positive amount (such as 1 ppm or greater) less than about 3 percent by weight, or less than about 2 percent by weight, or less than about 1.5 percent by weight, or less than about 1.0 percent by weight, or less than about 0.5 percent by weight, or less than about 0.4 percent by weight, or less than about 0.3 percent by weight, or less than about 0.25 percent by weight, or less than about 0.2 percent by weight, or from 1 ppm to about 1 percent, or from 1 ppm to about 0.5 percent, or from 1 ppm to about 0.4 percent, or from 1 ppm to about 0.3 percent, or from 1 ppm to about 0.25 percent, or from 1 ppm to about 0.2 percent; however, in other embodiments the compositions may be free of water. Free of water means less than about 1 ppm or less than about 1 ppb water.

The composition of this invention is suitable for use with all of the commonly employed positive and negative photoresists used in the semiconductor industry, including Merck AZ series positive photoresist; Dow Megaposit and SPR series positive photoresist; FujiFilm SC, IC, HR, and HNR series negative photoresist; FujiFilm OiR, GiR, HiPR series positive photoresist; and the like.

In the method of this invention, the compositions are mixed at room temperature with stirring for 30 min to 6 hours. (The method may be free of a heating step to remove sulfuric acid from the compositions.) Substrates, for example semiconductor wafers having metals (aluminum, copper, titanium, titanium tungsten, silver, nickel and nickel vanadium) (metallized inorganic substrate) and low and high k materials thereon, are patterned with photoresist, developed, plated with metals or undergo etch process, and contacted with the compositions disclosed herein for from about 5 to about 120 minutes, or from about 5 to about 60 minutes, or from about 5 to about 30 minutes, or from about 10 to about 120 minutes, or from about 10 to about 60 minutes, or from about 10 to about 30 minutes. The contacting step can occur by spraying, or dipping, or immersing in a bath at a temperature from about 60 to about 100° C., from about 70 to about 100° C., from about 80 to about 100° C., or from about 80 to about 95° C. After the contacting step is a step of rinsing with alcohol or water. The rinsing step can be by spraying, or dipping or immersing in a bath. The rinsing and/or contacting step can occur and/or alternate one or more times. A single wafer spray tool can be used and/or baths that accommodate 1-25 wafers can be used and/or a batch spray tool that accommodates multiple substrates, for example, 2-25 wafers can be used and/or a conveyor-based tool can be used. The times and temperatures can be adjusted by a person of ordinary skill in the art if needed. The method of this invention using the compositions of this invention provide Al etch rates of 2 Å/min or less, Ni etch rates of 1 Å/min or less and NiV etch rates of 3 Å/min or less.

Some embodiments of the compositions of the invention may be essentially free of, alternatively free of one or more than one of the following in any combination: catechol, phenol, hydroquinone, chlorinated hydrocarbon solvents, polar organic solvents, polar protic solvents, polar aprotic solvents, oxoammonium compounds, hydroxylamine and derivatives thereof, hydrogen peroxide, oxidants, organic bases, inorganic bases, non-alkaline metal hydroxides, alkaline metal hydroxides, fluorine-containing compounds, phosphorous-containing compounds, amines, quaternary ammonium hydroxides, tetraalkylammonium hydroxides, metal-containing compounds, triazole and triazole derivatives, benzotriazole. By essentially free it is meant an amount less than 1 percent, alternately less than 0.1 weight percent, alternately less than 0.01 weight percent, or less than 0.001 weight percent, or free of, where free of is non-detectable or 0.

The following non-limiting examples represent preferred forms and best modes contemplated by the inventor for practice of his invention, as well as illustrating the results obtained through its use.

EXAMPLES

The following Formulations 1-17 and Comparative Formulations 1-7 were made using commercially available components. The aromatic solvent naphtha refers to Sure Sol 150 commercially available from Flint Hills Resources. The isoparaffin solvent refers to Isopar M Fluid commercially available from ExxonMobil Chemical. The organic sulfonic acid is commercially available under the designation Calsoft LAS-99 from Pilot Chemical. The 1,2-dihydroxybenzene, 1,3-dihydroxybenzene, sorbitol, 4-tert-butyl catechol were obtained from Sigma-Aldrich. The compositions were prepared by mixing with agitation at room temperature without application of heat. All of the resulting solutions were a dark amber color and clear (single phase) with no precipitation.

TABLE 1

Formulations

| 1 | 2 | 3 | 4 |
|---|---|---|---|
| 64.5% aromatic solvent naphtha<br>35% organic sulfonic acid<br>0.5% tert-butylcatechol | 64% aromatic solvent naphtha<br>35% organic sulfonic acid<br>1% tert-butylcatechol | 64.5% aromatic solvent naphtha<br>35% organic sulfonic acid<br>0.5% resorcinol | 64% aromatic solvent naphtha<br>35% organic sulfonic acid<br>1% resorcinol |

| 5 | 6 | 7 | 8 |
|---|---|---|---|
| 63.5% aromatic solvent naphtha<br>35% organic sulfonic acid<br>1.5% resorcinol | 63% aromatic solvent naphtha<br>35% organic sulfonic acid<br>2% resorcinol | 64.5% aromatic solvent naphtha<br>35% organic sulfonic acid<br>0.5% sorbitol | 64% aromatic solvent naphtha<br>35% organic sulfonic acid<br>1% sorbitol |

| 9 | 10 | 11 | 12 | 13 |
|---|---|---|---|---|
| 63% aromatic solvent naphtha<br>35% organic sulfonic acid<br>2% sorbitol | 69.5% aromatic solvent naphtha<br>30% organic sulfonic acid<br>0.5% resorcinol | 69% aromatic solvent naphtha<br>30% organic sulfonic acid<br>1% resorcinol | 69.5% aromatic solvent naphtha<br>30% organic sulfonic acid<br>0.5% sorbitol | 69% aromatic solvent naphtha<br>30% organic sulfonic acid<br>1% sorbitol |

| 14 | 15 | 16 | 17 |
|---|---|---|---|
| 74.5% isoparaffin solvent<br>25% organic sulfonic acid<br>0.5% resorcinol | 74% isoparaffin solvent<br>25% organic sulfonic acid<br>1% resorcinol | 73.5% isoparaffin solvent<br>25% organic sulfonic acid<br>1.5% resorcinol | 73% isoparaffin solvent<br>25% organic sulfonic acid<br>2% resorcinol |

| Comparative Formulation 1 | Comparative Formulation 2 | Comparative Formulation 3 | Comparative Formulation 4 |
|---|---|---|---|
| 60% aromatic solvent naphtha<br>35% organic sulfonic acid<br>5% catechol | 64% aromatic solvent naphtha<br>35% organic sulfonic acid<br>1% catechol | 64.5% aromatic solvent naphtha<br>35% organic sulfonic acid<br>0.5% catechol | 65% aromatic solvent naphtha<br>35% organic sulfonic acid |

| Comparative Formulation 5 | Comparative Formulation 6 | Comparative Formulation 7 |
|---|---|---|
| 69% aromatic solvent naphtha<br>30% organic sulfonic acid<br>1% catechol | 70% aromatic solvent naphtha<br>30% organic sulfonic acid | 75% isoparaffin solvent<br>25% organic sulfonic acid |

Table 2 lists the amount of sulfuric acid present in the Formulations in Table 1, calculated based on the presence of 1 wt. % sulfuric acid in Calsoft LAS-99 organic sulfonic acid (as reported in U.S. Pat. No. 8,658,583). Therefore, for each formulation listed in Table 1, the actual amount of the organic sulfonic acid in each formulation equals the acid amount reported in Table 1 minus the weight percent sulfuric acid reported in Table 2.

TABLE 2

Amount of sulfuric acid present in formulations from Table 1.

| Formulation | Weight Percent Sulfuric Acid |
|---|---|
| 1 | 0.35% |
| 2 | 0.35% |
| 3 | 0.35% |
| 4 | 0.35% |
| 5 | 0.35% |
| 6 | 0.35% |
| 7 | 0.35% |
| 8 | 0.35% |
| 9 | 0.35% |
| 10 | 0.30% |
| 11 | 0.30% |
| 12 | 0.30% |
| 13 | 0.30% |
| 14 | 0.25% |
| 15 | 0.25% |
| 16 | 0.25% |
| 17 | 0.25% |
| Comparative Formulation 1 | 0.35% |
| Comparative Formulation 2 | 0.35% |
| Comparative Formulation 3 | 0.35% |
| Comparative Formulation 4 | 0.35% |
| Comparative Formulation 5 | 0.30% |
| Comparative Formulation 6 | 0.30% |
| Comparative Formulation 7 | 0.25% |

Example 1

Table 3 lists stripping compositions that were tested for Example 1 using an immersion process and semiconductor wafers with two types of negative polyisoprene-based photoresists: 7 μm thick Fujifilm SC-450 and 1 μm thick Fujifilm IC-59. For the immersion process, coupon-sized samples of semiconductor wafers were processed in beakers. Beakers were filled with 100 mL of a stripping composition and heated to the target temperature of 85° C. When the stripping composition was at the target temperature, a coupon was placed in a holder in the beaker, and slight agitation was provided by a stir bar. The temperature was maintained at the target temperature of 85° C. throughout the process. After a total processing time of 20 minutes, the coupons were removed from the beaker, rinsed with isopropyl alcohol, and dried with a stream of air. The process temperature for all compositions in Table 3 was 85° C.

For the experiments described above, resist removal was observed and noted accordingly. Resist removal is defined as "clean" if all resist was removed from the wafer coupon surface; as "mostly clean" if at least 95% of the resist was removed from the surface; "partly clean" if about 80% of the resist was removed from the surface. All four of the tested formulations were able to completely remove both photoresists.

TABLE 3

Resist removal results

| Formulation | SC-450 Resist Removal | IC-59 Resist Removal |
|---|---|---|
| Comparative Formulation 1 | Clean | Clean |
| Comparative Formulation 7 | Clean | Clean |
| 5 | Clean | Clean |
| 16 | Clean | Clean |

Example 2

Tables 4 and 5 list stripping compositions that were tested for Example 2 using an immersion process to measure etch rates of various metals. Testing was performed using semiconductor wafers coated with blanket metal films. For the immersion process, coupon-sized samples of semiconductor wafers were processed in beakers. Beakers were filled with 100 mL of a stripping composition and heated to the target temperature of 85° C. When the stripping composition was at the target temperature, a coupon was placed in a holder in the beaker, and slight agitation was provided by a stir bar. The temperature was maintained at the target temperature of 85° C. throughout the process. After a total processing time of 30 minutes, the coupons were removed from the beaker, rinsed with IPA, and dried with a stream of air.

The thickness of the metal films was measured before and after processing for each coupon that was tested using four-point probe to measure sheet resistance and calculate the thickness. The thickness for each coupon was the average from three measurements. Thickness change was used to calculate the average etch rate in Å/min. Etch rates were measured for aluminum (Al) and nickel (Ni) and nickel vanadium alloy (NiV). Al etch rates of 2 Å/min or less, Ni etch rates of 1 Å/min or less and NiV etch rates of 3 Å/min or less are desired.

TABLE 4

Aluminum etch rates (Å/min)

| Formulation | Al |
|---|---|
| 1 | 20.9 |
| 2 | 19.3 |
| 3 | 1.2 |
| 4 | 0.3 |
| 5 | 0.2 |
| 7 | 11.8 |
| 8 | 3.7 |
| 10 | 17.1 |
| 11 | 11.8 |
| 12 | 0.3 |
| 13 | 0.3 |
| 14 | 1.5 |
| 16 | 0 |
| 17 | 0 |
| Comparative 1 | 0.7 |
| Comparative 2 | 0.9 |
| Comparative 3 | 1.3 |
| Comparative 4 | 19.7 |
| Comparative 5 | 0.5 |
| Comparative 6 | 12.1 |
| Comparative 7 | 37.9 |

TABLE 5

Ni and NiV etch rates (Å/min)

| Formulation | Ni | NiV |
|---|---|---|
| 3 | 38.1 | |
| 4 | 8.7 | |
| 5 | 0.4 | 1.5 |
| 6 | 1.2 | |
| 7 | 42.7 | |
| 9 | 42.7 | |
| 13 | 1.8 | |
| 14 | 32.0 | 4.0 |
| 15 | 35.9 | |
| 16 | 0.4 | 0.7 |
| Comparative 1 | 1.1 | 3.1 |

Example 3

The effect of moisture level on aluminum etch rate was tested for Formulation 5. Table 6 lists measured moisture and aluminum etch rate for multiple batches of Formulation 5. Moisture level of the tested compositions was measured using Karl Fischer titration.

Testing was performed using semiconductor wafers coated with blanket aluminum films. For the immersion process, coupon-sized samples of semiconductor wafers were processed in beakers. Beakers were filled with 100 mL of a stripping composition and heated to the target temperature of 85° C. When the stripping composition was at the target temperature, a coupon was placed in a holder in the beaker, and slight agitation was provided by a stir bar. Temperature was maintained at the target temperature of 85° C. throughout the process. After a total processing time of 30 minutes, the coupons were removed from the beaker, rinsed with IPA, and dried with a stream of air.

The thickness of the aluminum films was measured before and after processing for each coupon that was tested using four-point probe to measure sheet resistance and calculate the thickness. The thickness for each coupon was the average from three measurements. Thickness change was used to calculate the average etch rate of aluminum in Å/min.

TABLE 6

Aluminum etch rates vs. moisture level for Formulation 5 with varying levels of moisture

| Batch | Moisture (%) | Al etch rate (Å/min) | Batch description |
|---|---|---|---|
| 1 | 0.47 | 11.7 | Prepared with Atosol 150 |
| 2 | 0.16 | 0.15 | Prepared with Sure Sol 150 |
| 3 | 0.66 | 34.5 | Prepared with Sure Sol 150 with extended mixing time |
| 4 | 0.14 | 0.1 | Prepared with Sure Sol 150 |
| 5 | 0.71 | 30.1 | Formulation 5 with 0.55% added water |

The results show that it is desirable to limit the water in the formulation to about 0.4% by weight or less or about 0.2% by weight or less.

Example 4

Table 7 lists the flashpoint of various formulations.

TABLE 7

Flashpoints

| Formulation | Flashpoint (° C.) |
|---|---|
| 5 | 80 |
| 16 | 98 |
| Comparative 1 | 80 |
| Comparative 7 | 98 |

Example 5

Tables 8 and 9 lists the solubility limits of catechol and resorcinol, respectively, in various formulations. Comparative Formulation 4 and Comparative Formulation 7 were used to determine solubility limits for catechol and resorcinol. The solubility limit was determined as the maximum amount of additive that would completely dissolve in the corresponding solution.

Table 8 lists the solubility limit for catechol in Comparative Formulation 4, and Table 9 lists the solubility limit for resorcinol in Comparative Formulation 4 and Comparative Formulation 7. For Comparative Formulation 4, the solubility limit for catechol was 5.0 wt. %, and the solubility limit for resorcinol was 3.5 wt. %. For Comparative Formulation 7, the solubility limit for resorcinol was 2.0 wt. %.

TABLE 8

Solubility Limit of Catechol in Comparative Formulation 4

| Sample | Amount Comparative Formulation 4 | Amount Catechol Added | Result |
|---|---|---|---|
| 1 | 95.25 g | 4.75 g | Complete dissolution |
| 2 | 95 g | 5.0 g | Complete dissolution |
| 3 | 94.88 g | 5.12 g | Incomplete dissolution |

TABLE 9

Solubility Limit of Resorcinol in Comparative Formulation 4 and Comparative Formulation 7

| Sample | Formulation | Amount of formulation | Amount Resorcinol Added | Result |
|---|---|---|---|---|
| 1 | Comparative 4 | 97 g | 3.0 g | Complete dissolution |
| 2 | Comparative 4 | 96.5 g | 3.5 g | Complete dissolution |
| 3 | Comparative 4 | 96.25 g | 3.75 g | Incomplete dissolution |
| 4 | Comparative 7 | 98.5 g | 1.5 g | Complete dissolution |
| 5 | Comparative 7 | 98 g | 2.0 g | Complete dissolution |
| 6 | Comparative 7 | 97.75 g | 2.25 g | Incomplete dissolution |

Example 6

The characterization of corrosion rate was performed using the Tafel analysis method well known in electrochemistry. Three-electrode electrochemical system was used to measure Tafel plots of Formulation 5 and Comparative Formulation 1 at room temperature. 1.5 $cm^2$ of coupons coated with 1000 Å aluminum (with 0.5 wt. % copper) were used as the working electrodes. The Ag/AgCl electrode was used as reference while a platinum wire was used as the counter electrode.

The electrochemical potential versus current density for Al (0.5 wt. % Cu) samples was measured in the two formulations at room temperature with a scan rate of 2 mV/sec. FIG. 1 shows Tafel plots for Formulation 5 and Comparative Formulation 1. From the Tafel plots, Formulation 5 showed slightly lower corrosion current than Comparative Formulation 1. The anodic polarization scans shown in FIG. 1 exhibit different inhibition behavior for resorcinol and catechol in Formulation 5 and Comparative Formulation 1, respectively. Resorcinol used as inhibitor showed a passivation process in the anodic scan in FIG. 1, while no passivation was found for catechol as inhibitor. This passivation behavior indicated that a passive film would likely form on the AlCu surface by 1.5 wt. % of resorcinol in Formulation 5, while no passive film would form using Comparative Formulation 1, even with 5 wt. % catechol being used.

Figure 2:
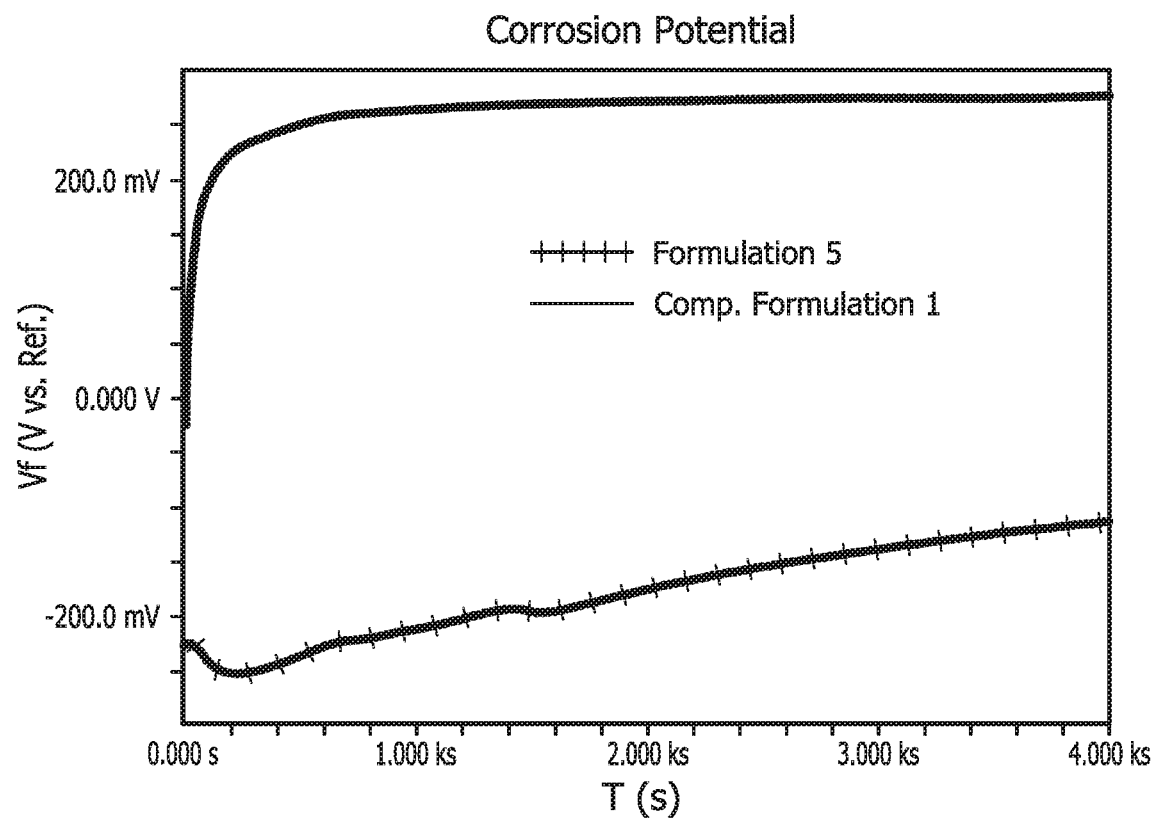
FIG. 2 is a plot of the open circuit potential for Formulation 5 and Comparative Formulation 1.

The different inhibition behavior of resorcinol and catechol is also observed from the open circuit potential (OCP) tests shown in FIG. 2. For Formulation 5, OCP for AlCu substrate showed a gradual increase over 4000 seconds. This indicates resorcinol gradually adsorbs onto the AlCu surface forming a passivation layer that provides aluminum corrosion inhibition. For Comparative Formulation 1, OCP for the AlCu substrate quickly increased in 200 seconds and then was stabilized in less than 1000 seconds, indicating that catechol does not adsorb onto the AlCu surface and does not provide a passivation layer.

TABLE 10

Corrosion rate and corrosion potential (Ecorr) for Formulation 5 and Comparative Formulation 1.

| Formulation | Corrosion rate (Å/min) | Ecorr (V) |
|---|---|---|
| 5 | 0.0021 | −0.424 |
| Comparative Formulation 1 | 0.0030 | 0.162 |

It should now be apparent to those skilled in the art that a novel photoresist stripping composition and method capable of achieving the stated objects of this invention has been provided. The results indicate that the compositions of this invention provided improved results as compared with the results achieved by the comparative examples. No attack on aluminum metallurgy or silicon dioxide insulators on silicon wafers is observed with the present invention.

It is believed that the compositions of this invention may be used for removal of other materials including different polymers, foams, resins, coatings, adhesives, and monomers from various substrates. This includes removal, cleaning, flushing or dissolution of cured and uncured urethanes, polyurethane, polyurethane foam, urethane foam, urethane conformal coatings, urethane adhesives, polyurea, polyurea coatings, acrylic adhesives, methacrylate adhesives, cured and uncured epoxy, amine-cured epoxy, anhydride-cured epoxy, phenol-cured epoxy, novolac epoxy, silicone conformal coatings, silicone polymers, cured silicone, silicone oils, silicone mold release agents, cured and uncured polyimide, polysulfide, polyvinyl acetate, poly (ethylene-vinyl acetate), liquid isocyanate, cured cyanoacrylate adhesives, crystallized isocyanate, reactive hot melt adhesive, flux, ink, paint, rosin, parylene, and uncured resin or cured resin used in stereolithography processes. Substrates may include processing equipment and tooling used for wire coating, optical fiber coating, injection molding, extrusion, mixing, dispensing, roll coaters, lamination, asphalt processing, oil and petroleum processing, 3D printing, and stereolithography. Substrates also may include printed circuit boards, potting boxes, electronic components, and assembled electronics. Substrate materials may include stainless steel, steel, aluminum, iron, brass, copper, nickel, zinc, glass, silicon dioxide, epoxy, fiberglass, thermoplastic polymers, thermosetting polymers, acrylonitrile butadiene styrene polymers, nylon, polyester, polyamide, polycarbonate, polypropylene, polyethylene, polyvinyl chloride, polyurethane, polytetrafluoroethylene, and rubber.

It should further be apparent to those skilled in the art that various changes in form and details of the invention as described may be made. It is intended that such changes be included within the spirit and scope of the claims appended hereto.

The invention claimed is:

1. A composition for the removal of an organic photoresist and/or other materials from a substrate, which comprises: from about 20 to about 40% by weight aryl sulfonic acid or alkylaryl sulfonic acid or mixtures thereof; about 0.2 to about 3.5% weight 1,3-dihydroxybenzene (resorcinol); and from about 60 to about 85% by weight of one or more hydrocarbon solvents having a flash point of greater than about 65° C., wherein said weight % are based on the total weight of the composition.

2. The composition of claim 1, further comprising water at less than about 3% by weight based on the total weight of the composition.

3. The composition of claim 1 comprising greater than about 0.08% by weight sulfuric acid.

4. The composition of claim 1 wherein said composition comprises said aryl sulfonic acid.

5. The composition of claim 1 wherein said composition comprises said alkylaryl sulfonic acid.

6. The composition of claim 1 wherein said composition comprises 0.2 to about 2.0 weight % of said 1,3-dihydroxybenzene.

7. The composition of claim 2 wherein said composition comprises said water at a positive amount up to about 0.5 weight percent or less.

8. The composition of claim 3 wherein said composition comprises sulfuric acid in an amount from about 0.08 to less than 1 percent by weight based on the total weight of the composition.

9. The composition of claim 1 wherein said composition comprises said 1,3-dihydroxybenzene in an amount from about 0.5 to about 3.5 weight percent based on the total weight of the composition.

10. The composition of claim 9 wherein said composition comprises said aryl sulfonic acid or said alkylaryl sulfonic acid or said mixtures thereof in an amount from about 22 to about 38% by weight based on the total weight of the composition.

11. The composition of claim 10 wherein said composition comprises said water at a positive amount up to about 0.5 weight percent or less based on the total weight of the composition.

12. The composition of claim 1 wherein said one or more hydrocarbon solvents have a flash point of from about 65° C. to 85° C., or from about 90° C. to 100° C.

13. The composition of claim 1 wherein said one or more hydrocarbon solvents are refined from petroleum and said hydrocarbons comprise C8-C18 hydrocarbons at an amount greater than about 50% of the total weight of said hydrocarbon solvents in said composition.

14. The composition of claim 1 wherein said one or more hydrocarbon solvents comprises greater than 50% of aliphatic containing hydrocarbons by weight of the total weight of the hydrocarbon solvents in said composition.

15. The composition of claim 1 wherein said one or more hydrocarbon solvents comprises greater than 50% of aromatic containing hydrocarbons by weight of the total weight of the hydrocarbon solvents in said composition.

16. The composition of claim 1 wherein said hydrocarbon solvent comprises greater than 50% by weight xylene.

17. The composition of claim 16 wherein said composition comprises water at a positive amount up to about 0.5 weight percent or less.

18. A method of stripping photoresist and/or other materials from a substrate, which comprises the steps of: providing the composition of claim 1 and contacting the photoresist with the composition at a temperature from about 60 to about 100° C. for from about 5 to about 120 minutes.

19. The method of claim 18 wherein the substrate is a silicon wafer having a silicon dioxide insulation layer metallized with one or more metals selected from aluminum, titanium, titanium tungsten, silver, nickel, nickel vanadium and copper.

20. The method of claim 19 wherein said method provides Al etch rates of 2 Å/min or less, Ni etch rates of 1 Å/min or less, or NiV etch rates of 3 Å/min or less.

21. A composition for the removal of an organic photoresist and/or other materials from a substrate, which comprises: from about 20 to about 40% by weight aryl sulfonic acid or alkylaryl sulfonic acid or mixtures thereof; about 0.2 to about 3.5% weight 1,3-dihydroxybenzene (resorcinol); and from about 60 to about 85% by weight of one or more hydrocarbon solvents having a boiling point of greater than about 180° C., wherein said weight % are based on the total weight of the composition.

* * * * *